(12) United States Patent
Molchadsky

(10) Patent No.: US 11,374,418 B2
(45) Date of Patent: Jun. 28, 2022

(54) MULTI-BATTERY ANALYZING SERVER BASED ON AN INTEGRATED BATTERY

(71) Applicant: GALOOLI LTD., Tel Aviv (IL)

(72) Inventor: Itamar Molchadsky, Sede Warburg (IL)

(73) Assignee: GALOOLI LTD., Tel-Aviv (IL)

( * ) Notice: Subject to any disclaimer, the term of this patent is extended or adjusted under 35 U.S.C. 154(b) by 235 days.

(21) Appl. No.: 16/610,517

(22) PCT Filed: Nov. 4, 2019

(86) PCT No.: PCT/IL2019/050208
§ 371 (c)(1),
(2) Date: Nov. 4, 2019

(87) PCT Pub. No.: WO2020/170235
PCT Pub. Date: Aug. 27, 2020

(65) Prior Publication Data
US 2021/0336460 A1    Oct. 28, 2021

(51) Int. Cl.
| | | |
|---|---|---|
| *H02J 7/00* | (2006.01) | |
| *G01R 31/389* | (2019.01) | |
| *G01R 31/396* | (2019.01) | |
| *G01R 31/3842* | (2019.01) | |
| *G01R 31/374* | (2019.01) | |

(Continued)

(52) U.S. Cl.
CPC .......... *H02J 7/0047* (2013.01); *G01R 31/374* (2019.01); *G01R 31/389* (2019.01); *G01R 31/3842* (2019.01); *G01R 31/396* (2019.01); *H01M 10/4257* (2013.01); *H02J 7/0013* (2013.01); *H02J 7/00032* (2020.01); *H04L 67/125* (2013.01)

(58) Field of Classification Search
CPC .... H02J 7/0047; H02J 7/0013; H02J 7/00032; G01R 31/3842; G01R 31/374; G01R 31/389; G01R 31/396; H01M 10/4257; H04L 67/125
USPC ........................................................ 320/134
See application file for complete search history.

(56) References Cited

U.S. PATENT DOCUMENTS 7,672,695 B1 * 3/2010 Rainnie ............. H04W 52/0277
455/343.1
9,018,914 B2 * 4/2015 Genova ..................... H02J 7/00
320/134

(Continued)

FOREIGN PATENT DOCUMENTS

WO    WO-2011014843 A1 *  2/2011    .......... B60L 11/1816

OTHER PUBLICATIONS

Office Action for KR Application No. 10-2021-7028276, dated Dec. 15, 2021.

*Primary Examiner* — M Baye Diao
(74) *Attorney, Agent, or Firm* — Pearl Cohen Zedek Latzer Baratz LLP

(57) ABSTRACT

A system for dealing with rechargeable batteries, including a computerized server, a monitoring circuit installed in a rechargeable battery and configured to periodically sample the status of the rechargeable battery and communicate the sampled information to the server, wherein the server analyzes the sampled information from the monitoring circuits of one or more rechargeable batteries and provides instructions for dealing with each rechargeable battery to a communication device of an administrator in charge of dealing with each rechargeable battery.

18 Claims, 3 Drawing Sheets

(51) Int. Cl.
*H01M 10/42* (2006.01)
*H04L 67/125* (2022.01)

(56) References Cited

U.S. PATENT DOCUMENTS

| | | |
|---|---|---|
| 10,816,607 B2 * | 10/2020 | Karner .................. G01R 31/367 |
| 2003/0184307 A1 | 10/2003 | Kozlowski et al. |
| 2012/0274280 A1 | 11/2012 | Yip et al. |
| 2012/0299721 A1 * | 11/2012 | Jones .................. G01R 31/3835 |
| | | 340/521 |
| 2012/0310568 A1 | 12/2012 | Wang et al. |
| 2015/0048797 A1 | 2/2015 | Song |
| 2016/0161367 A1 * | 6/2016 | Chu ...................... G01M 15/02 |
| | | 324/433 |
| 2017/0003356 A1 | 1/2017 | Kaib et al. |
| 2017/0197513 A1 | 7/2017 | Muzaffer |
| 2017/0271912 A1 | 9/2017 | Bhowmik et al. |
| 2018/0267109 A1 | 9/2018 | Kutkut |
| 2019/0033381 A1 | 1/2019 | Karner et al. |
| 2019/0033382 A1 | 1/2019 | Karner et al. |
| 2019/0033397 A1 * | 1/2019 | Karner .................. H01M 10/48 |
| 2019/0237814 A1 * | 8/2019 | Waters ..................... G08B 5/36 |

* cited by examiner

ID
MULTI-BATTERY ANALYZING SERVER BASED ON AN INTEGRATED BATTERY

TECHNICAL FIELD

The present disclosure relates generally to rechargeable batteries and more particularly to a monitoring circuit embedded within a rechargeable battery.

BACKGROUND

Rechargeable batteries are used in many applications, for example as backup power for electrical powered systems or as the power source for motorized vehicles and machinery. For example telephone switchboards or cellular telephone networks may be powered by a wired electricity network from an electricity provider but may have multiple rechargeable batteries in a power cabinet to keep the switchboard or network functioning in case of power failure. Likewise a warehouse may use battery powered forklifts or other motorized machinery to operate the warehouse.

The rechargeable batteries may be charged and discharged regularly according to a maintenance schedule to prolong their life. Generally the maintenance schedule is designed for an average battery and not based on the actual status of a specific battery. Some batteries (e.g. for powering a motorized forklift) may be charged every night and have the power consumed every day. Alternatively, some batteries may only have their power consumed when there is a power failure in the wired electricity network. Therefore it is hard to provide accurate instructions for dealing with a specific battery.

Additionally, the recommendations from the manufacturer for dealing with the battery especially for new models may be based on theoretical knowledge and not from actual usage in the field, which is hard to accurately acquire. Even when such information is collected from users it may not be accurate since it relies on user recorded information and not from actual measurements in the battery.

SUMMARY

An aspect of an embodiment of the disclosure relates to a monitoring circuit that is installed within a rechargeable battery to monitor the status of the battery and provide information collected by the monitoring circuit to a server. The server analyzes the information from multiple users using the same model battery and provides instructions regarding the care for the battery to increase the battery life. The status information includes keeping track of the charge level of the battery, when the battery was charged and indications regarding the current health of the battery. The server analyzes the history of many batteries and determines rules for prolonging the life of the battery. Optionally, the server may use a classifier to build a statistical model or train a neural network to provide instructions based on the status information provided by the battery.

There is thus provided according to an exemplary embodiment of the disclosure, a system for monitoring rechargeable batteries, comprising:

A computerized server;

A monitoring circuits installed in a rechargeable battery and configured to periodically sample the status of the rechargeable battery and communicate the sampled information to the server;

Wherein the server analyzes the sampled information from the monitoring circuits of one or more rechargeable batteries and provides instructions for dealing with each rechargeable battery to a communication device of an administrator in charge of dealing with each rechargeable battery.

In an exemplary embodiment of the disclosure, the monitoring circuit comprises a voltage sensor, a current sensor and a resistance sensor. Optionally, the monitoring circuit comprises a global positioning system chip. In an exemplary embodiment of the disclosure, the monitoring circuit comprises a temperature sensor. Optionally, the monitoring circuit periodically communicates the status information to the server at a lower frequency than sampling the status. In an exemplary embodiment of the disclosure, the monitoring circuit includes a storage mode of operation in which the monitoring circuit tests the rechargeable battery to determine if the rechargeable battery has been connected to a consumer device to be charged and provide power, and does not communicate with the server. Optionally, the monitoring circuit automatically changes from the storage mode to a consumer mode that periodically samples the status of the rechargeable battery, when the monitoring circuit identifies that the rechargeable battery started to receive charge or started to provide charge at the inputs or outputs of the rechargeable battery. In an exemplary embodiment of the disclosure, the status of the rechargeable battery includes measurement of internal resistance and internal charge. Optionally, the server builds a statistical model from the sampled status of multiple monitoring circuits, to recommend maintenance of the battery based on the sampled status of the rechargeable battery. Alternatively or additionally, the server trains a neural network from the sampled status of multiple monitoring circuits, to recommend maintenance of the rechargeable battery based on the sampled status of the battery.

There is further provided according to an exemplary embodiment of the disclosure, a method of monitoring rechargeable batteries, comprising:

Periodically sampling the status of a rechargeable battery by a monitoring circuit installed in the rechargeable battery;

Communicating the sampled information to a computerized server;

Analyzing the sampled information from the monitoring circuits of one or more rechargeable batteries at the server; and Providing instructions for dealing with each rechargeable battery to a communication device of an administrator in charge of dealing with each rechargeable battery.

BRIEF DESCRIPTION OF THE DRAWINGS

The present disclosure will be understood and better appreciated from the following detailed description taken in conjunction with the drawings. Identical structures, elements or parts, which appear in more than one figure, are generally labeled with the same or similar number in all the figures in which they appear, wherein.

DETAILED DESCRIPTION

Figure 1:
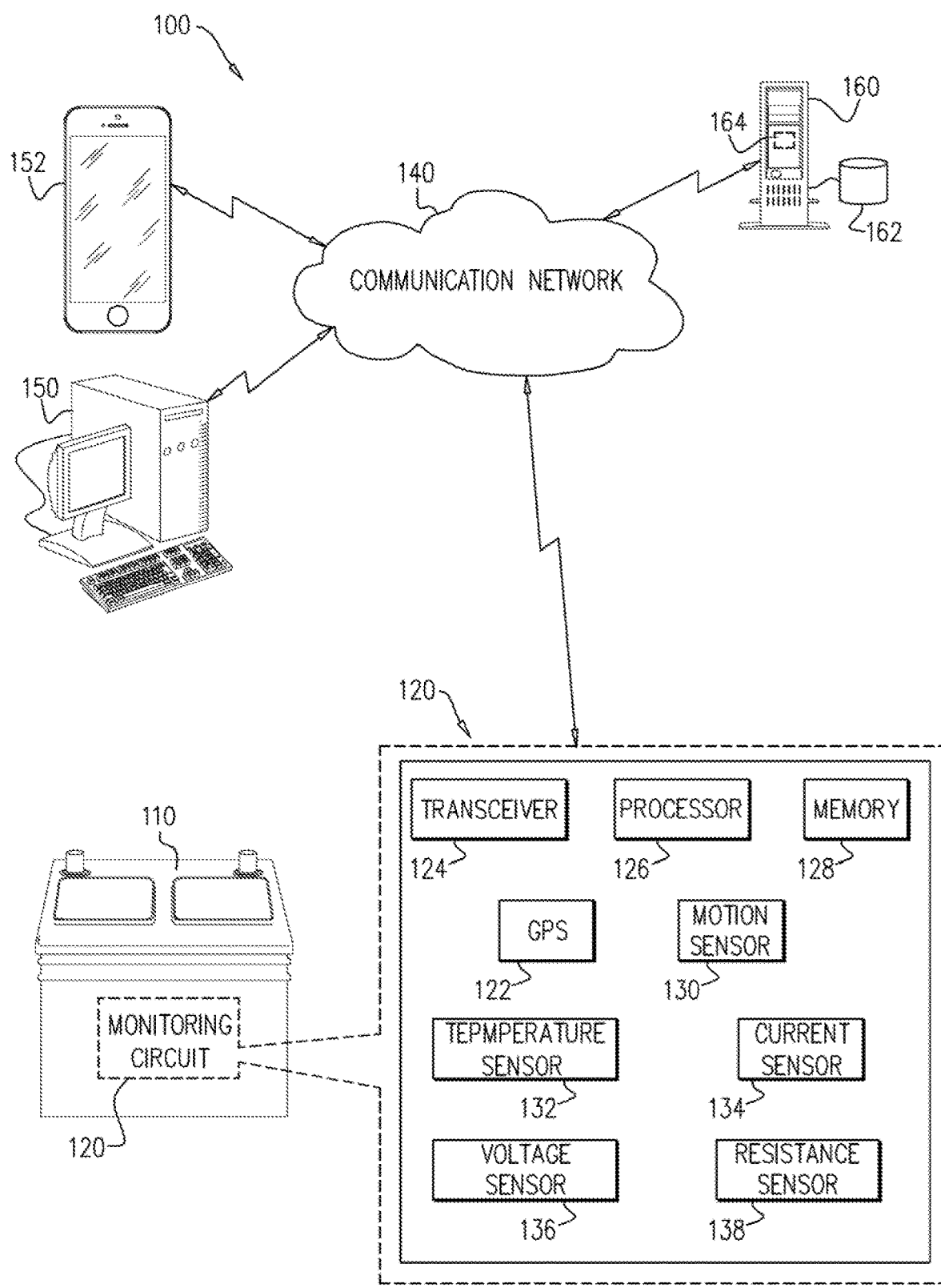
FIG. 1 is a schematic illustration of a system including a server and a rechargeable battery with a monitoring circuit, according to an exemplary embodiment of the disclosure.

FIG. 1 is a schematic illustration of a system 100 including a computerized server 160 and a rechargeable battery 110 with a monitoring circuit 120, according to an exemplary embodiment of the disclosure. In an exemplary embodiment of the disclosure, the monitoring circuit 120 is initially installed within the rechargeable battery 110 during manufacture of the rechargeable battery 110. Alternatively, the monitoring circuit may be connected to the battery externally. Optionally, the monitoring circuit 120 includes a processor 126 and a memory 128 to control functionality of the monitoring circuit 120. In an exemplary embodiment of the disclosure, when the battery 110 is installed in a consumer device the monitoring circuit 120 monitors the status of the battery 110 and transmits the information to server 160. Server 160 analyzes the information and provides recommendations for handling the battery 110 to an administrator that is in charge of the battery 110 based on the actual measurements from within the battery 110. Additionally, server 160 collects status information from multiple batteries (e.g. optimally all batteries in use of each model) and improves the recommendations based on the experience of the multiple batteries. The recommendations can instruct the administrator when to charge the specific battery 110 (e.g. every day or every two days), when to discharge the specific battery 110 (e.g. for devices that only discharged the battery when there is a power failure), when to discard/recycle the battery 110 (e.g. if the battery reaches a state that it cannot hold a minimal amount of charge). The instructions enhance the quality of the environment by extending the life of battery 110, reducing pollution and distancing the need to recycle the components of the battery.

In an exemplary embodiment of the disclosure, the monitoring circuit includes a global positioning system (GPS) chip 122 to identify the location of the monitoring circuit 120 and a wireless transceiver 124 to communicate with a server 160 over a communication network 140. Optionally, the wireless transceiver 124 may communicate over a cellular network (e.g. using CDMA, GSM and/or LTE protocols), RF network or other types of wireless communication networks.

In an exemplary embodiment of the disclosure, monitoring circuit 120 includes a motion sensor 130 (e.g. a magnetometer, accelerometer, gyroscope) to identify motion or vibrations of the rechargeable battery 110. Additionally, the monitoring circuit 120 may include a temperature sensor 132 to sense the conditions in which the battery is functioning and which may affect the internal resistance and time required to charge or discharge the battery. Further additionally, the battery may include a current sensor 134, a voltage sensor 136 and/or a resistance sensor 138 to evaluate the power consumption status of the battery.

In an exemplary embodiment of the disclosure, the status information transmitted to the server 160 can include:

1. A unique ID of the battery, for example a unique serial number;
2. A time stamp of the time at which the status of the battery was sampled;
3. Internal resistance of the battery;
4. Voltage measured from the input/output line of the battery;
5. Current consumption measured from the input/output line of the battery;
6. Temperature inside the battery;
7. Geographic location of the battery (e.g. based on readings of the GPS chip 122);
8. Motion status of the battery (e.g. if the battery is stationary or in motion);
9. Charge status (e.g. level of charge, depth of discharge, time required to charge, time required to discharge); and other parameters In an exemplary embodiment of the disclosure, the server 160 receives information of each battery 110 in use and keeps track of usage history of the battery including number of times charged, charge level after each charge cycle, battery power before/after charging and/or additional details that reflect the current health of the battery 110 (e.g. indicating if a battery is getting weaker, holds less charge or reaches a level in which the battery can no longer be used or needs special treatment). Server 160 analyzes the information using artificial intelligence (AI) algorithms and/or machine learning algorithms to determine how to optimally handle the rechargeable batteries 110 of a specific model, for example to prolong the battery life and enhance the battery performance. Optionally, server 160 applies a classifier to build a statistical model or train a neural network to recommend maintenance of the battery to maximize the life of the battery 110. In an exemplary embodiment of the disclosure, server 160 compares the treatment received by batteries that are getting weaker to batteries that remained strong.

In an exemplary embodiment of the disclosure, the models used may include decision trees, K-nearest neighbors, artificial neural networks and/or support vector machines. Optionally, server 160 stores the status information received from batteries 110 in a database 162 and employs an analysis program 164 to analyze the status information.

Figure 2:
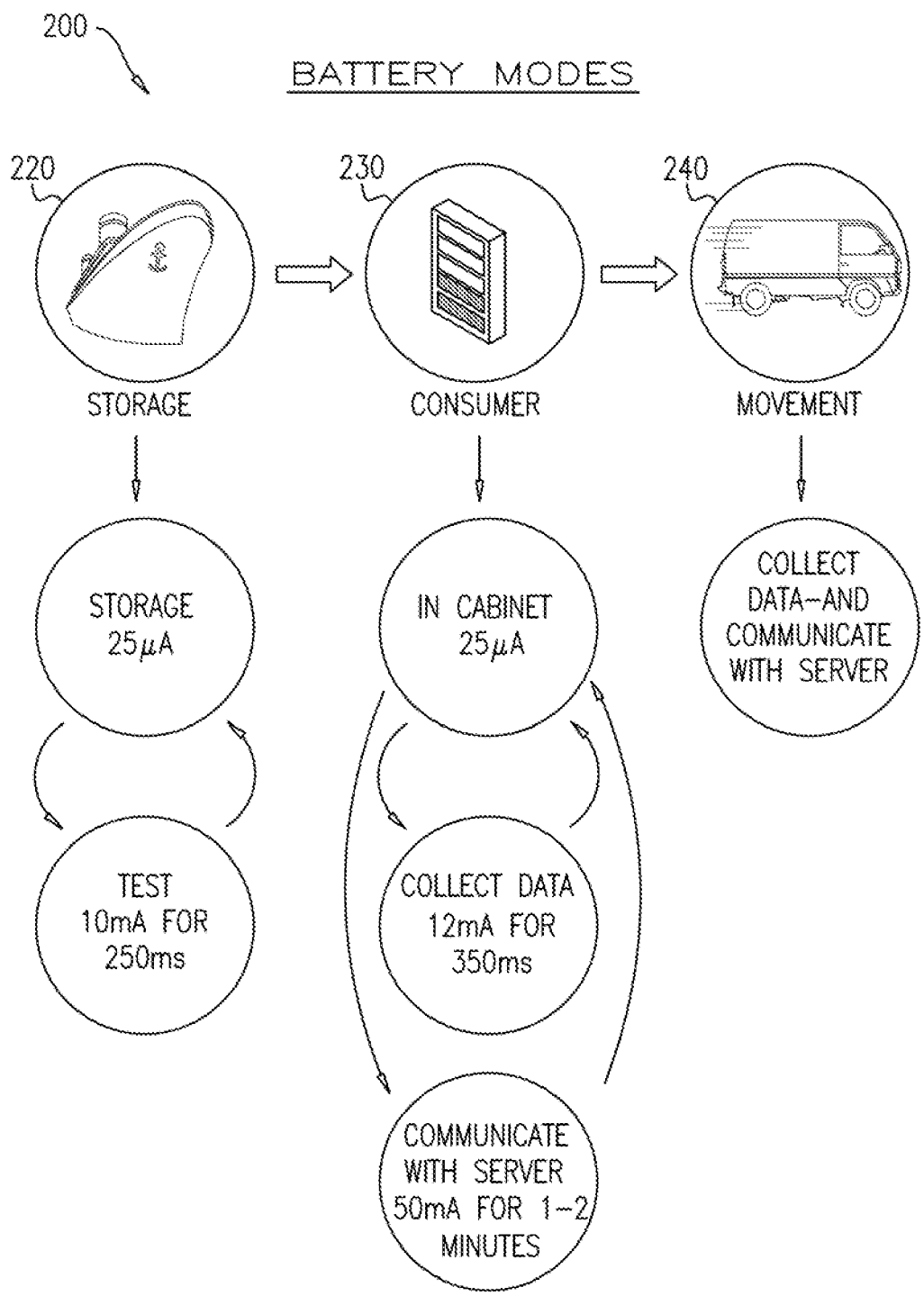
FIG. 2 is a schematic illustration of operation modes of the monitoring circuit, according to an exemplary embodiment of the disclosure.

FIG. 2 is a schematic illustration of operation modes 200 of the monitoring circuit 120, according to an exemplary embodiment of the disclosure. In an exemplary embodiment of the disclosure, the monitoring circuit 120 is in one of the following modes 200:

1. Storage mode 220—wherein the battery 110 is being shipped to the consumer, the monitoring circuit 120 is initially powered up and consumes a minimal amount of current, for example about 25 μA. Optionally, periodically (e.g. every few minutes) the monitoring circuit 120 tests the battery 110 consuming a larger amount of current (e.g. 10 mA) for a short period (e.g. 250 ms) to determine if the battery 110 is receiving power or providing power (e.g. being charged or discharged) to determine if the monitoring circuit 120 should remain in storage mode or change to another mode.

2. Consumer mode 230—wherein the battery 110 is installed at the consumer (e.g. as part of a power backup cabinet). In this mode monitoring circuit 120 is mainly waiting and consumes a minimal amount of current, for example about 25 μA while waiting, however periodically (e.g. every few minutes) monitoring circuit 120 samples the status of the battery 110. Optionally, the status information may include for example the time, the temperature, the internal resistance of the battery, voltage or current on the output or input of the battery, if the battery is being charged or providing charge, the location of the battery 110 or other information. In an exemplary embodiment of the disclosure, monitoring circuit 120 stores the information in memory 128 for transmitting to server 160 at a later time. In an exemplary embodiment of the disclosure, sampling consumes more power than waiting (e.g. about 12 mA for about 350 ms). Optionally, periodically (e.g. once a day or every few hours) monitoring circuit 120 communicates with server 160 to relay the stored information including identification of the battery 110 (e.g. a unique battery identifier), so that the server can monitor usage of the battery as explained above (e.g. including keeping track of charging and discharging of the battery). In an exemplary embodiment of the disclosure, communicating may consume about 50 mA for about 1-2 minutes. Optionally, while communicating the server receives the information from the monitoring circuit 120 and can provide instructions to the monitoring circuit 120, for example to increase/decrease the sampling frequency or increase/decrease the period for communicating with the server. In an exemplary embodiment of the disclosure, sampling is performed at a frequency that is higher than the frequency of communicating. Alternatively, the frequencies may be equal or almost equal.

In some embodiments of the disclosure, server 160 provides notifications to a system administrator in charge of handling battery 110, for example to immediately discharge or charge the battery or to schedule maintenance at a specific time (e.g. charging or discharging at a specific time). Optionally, the administrator may have a computer 150 or smartphone 152 or other communication device to receive the notifications from the server 160. Alternatively or additionally, server 160 may send the administrator an email, SMS or other type of message.

3. Movement mode 240 —if during sampling in consumer mode 230 the monitoring circuit 120 determines that an event occurred, for example the battery 110 is disconnected from the wired power source, is in motion, the battery 110 moved out of a specific geographic boundary, the battery 110 is disconnected for more than a preselected amount of time, the battery 110 is disconnected and in motion or other occurrences that do not match preprogrammed settings of the battery 110 then monitoring circuit 120 immediately communicates with server 160 and starts to continuously notify the server 160 of its location (e.g. based on the measurements of the GPS chip 122). Server 160 then notifies the system administrator by device 150 or 152 of the event. In an exemplary embodiment of the disclosure, monitoring circuit 120 continues to communicate with server 160 (e.g. every few minutes or seconds) as long as the battery 110 can power the monitoring circuit (e.g. for about 1-7 days). Optionally, server 160 may instruct monitoring circuit 120 to increase or decrease the reporting rate. For example if the battery 110 is far away from a security force, server 160 may instruct the monitoring circuit 120 to reduce the commination frequency to prolong battery life, whereas when the security forces are near, server 160 may instruct monitoring circuit 120 to increase the communication rate. Optionally, if the battery 110 was intentionally removed by the system administrator, the system administrator may notify server 160 to notify monitoring circuit 120 to return to storage mode 220 as if it is being shipped and waiting for installation at the consumer. Likewise the system administrator or server 160 may instruct monitoring circuit 120 to return to consumer mode 230 (e.g. if no real problem occurred—a false event).

Figure 3:
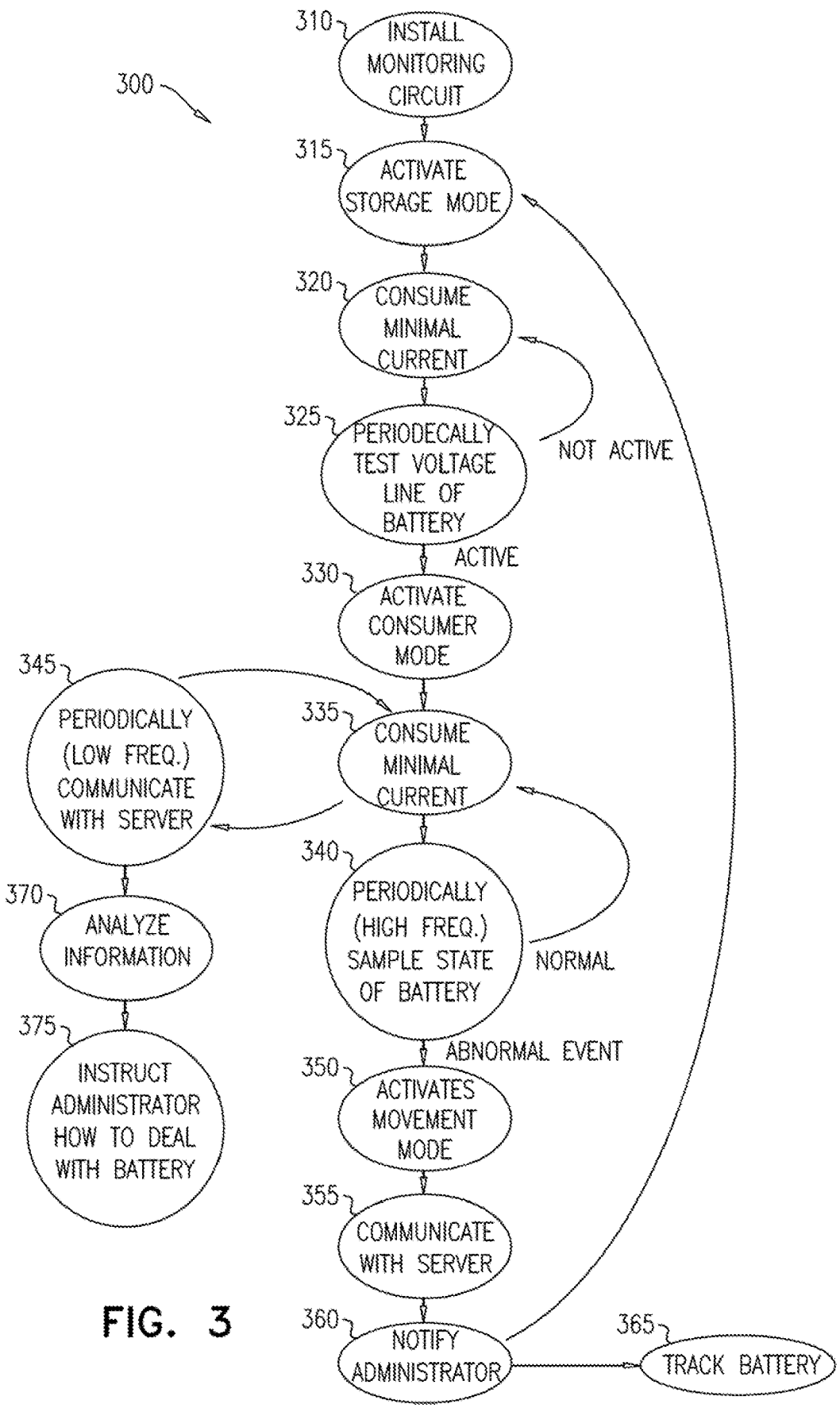
FIG. 3 is a flow diagram of a method of monitoring rechargeable batteries, according to an exemplary embodiment of the disclosure.

FIG. 3 is a flow diagram of a method 300 of monitoring rechargeable batteries 110, according to an exemplary embodiment of the disclosure. In an exemplary embodiment of the disclosure, the monitoring circuit 120 is installed (310) in battery 110. The monitoring circuit 120 activates (315) storage mode 220 for marketing the battery 110 and shipping the battery 110 to a consumer. In storage mode 220 the battery is programmed to consume (320) minimal current (e.g. taking minimal actions such as programming processor 126 to execute a timer or counter to decide when to perform actions). Periodically the monitoring circuit 120 tests (325) the voltage input/output line of the battery 110 to determine if the battery has been installed in a consumer system and is activated. If not activated monitoring circuit 120 continues to consume minimal current to prolong the life of the battery 110. If activated monitoring circuit 120 activates (330) consumer mode 230 in which it is charged and discharged as needed to serve as part of the consumer system (e.g. a power backup system of a communication network).

In consumer mode 230 monitoring circuit 120 generally consumes minimal current (335) and periodically with a high frequency (e.g. every 5-10 minutes) samples (340) the state of the battery to record the activities and health of the battery. Optionally, the sampled information is recorded in memory 128 of battery 110. Additionally, periodically with a low frequency (e.g. once every 12 hours or once a day) monitoring circuit 120 communicates (345) with server 160 to provide the sampled information from memory 128 for analysis and to receive commands from the server 160.

In an exemplary embodiment of the disclosure, server 160 analyzes (370) the information in real-time and instructs the monitoring circuit 120 responsive to the sampled information that was provided, for example to increase or decrease the sampling rate or communication rate. Alternatively or additionally, server 160 analyzes (370) the sampled information and transmits instructions to the system administrator how to deal with the battery (375) to enhance the health of the battery 110, for example to charge the battery at a specific time or refrain from charging the battery for a specific amount of time (e.g. to disconnect the charge power and wait another day until recharging the battery).

In an exemplary embodiment of the disclosure, when sampling (340) the state of the battery monitoring circuit 120 analyzes the sampled information to identify if the state is normal or if an abnormal event occurred, for example the battery 110 is disconnected from the power source, is disconnected from providing power to a consumer system, if the battery is in motion or if the battery exited or entered a predefined geographical region or a combination of the above. Optionally, if an abnormal event occurred monitoring circuit 120 activates (350) movement mode 240 in which the monitoring circuit 120 begins to communicate (355) with the server at a high frequency, for example every 1-5 minutes. Optionally, the monitoring circuit 120 continuously retrieves location information from GPS chip 122 and transmits it to server 160.

In an exemplary embodiment of the disclosure, server 160 notifies (360) the system administrator to check the physical location of the system where the battery was installed to confirm if the battery 110 was stolen or if it was removed for maintenance or monitoring circuit 120 gave notification for other reasons. Accordingly, the system administrator may instruct the server 160 to reset the operation mode of the monitoring circuit 120, for example back to activate (315) storage mode 220, for example in a case that the battery was disconnected for shipping to a different location. Alternatively, the system administrator may request to reset monitoring circuit 120 back to consumer mode 230, in case of a false alarm. Further alternatively, if the battery was stolen, the system administrator may track the battery (365) to repossess it with the help of security forces.

In an exemplary embodiment of the disclosure, server 160 transfers the location information from monitoring circuit 120 to the system administrator devices (150, 152) or enables the administrator devices (150, 152) to access the information, for example by an application that receives data from the server, so that the battery 110 may be located by the system administrator and/or law enforcement forces. In some embodiments of the disclosure, server 160 may provide instructions to monitoring circuit 120, for example to increase or decrease the frequency for communicating with the server 160 or to change modes of operation, for example to return to consumer mode 230 or storage mode 220.

It should be appreciated that the above described methods and apparatus may be varied in many ways, including omitting or adding steps, changing the order of steps and the type of devices used. It should be appreciated that different features may be combined in different ways. In particular, not all the features shown above in a particular embodiment are necessary in every embodiment of the disclosure. Further combinations of the above features are also considered to be within the scope of some embodiments of the disclosure. It will also be appreciated by persons skilled in the art that the present disclosure is not limited to what has been particularly shown and described hereinabove.

I claim:

1. A system for monitoring rechargeable batteries, comprising:
    a server;
    a monitoring circuit installed in a rechargeable battery and configured to:
        periodically sample the status of the rechargeable battery and communicate, by a wireless transceiver, the sampled status to the server, and
        automatically change a mode of operation when the monitoring circuit identifies that the rechargeable battery started to receive charge or started to provide charge at the inputs or outputs of the rechargeable battery, wherein the mode controls an amount of power consumed by the monitoring circuit; and
    wherein the server analyzes the sampled status from the monitoring circuit of the rechargeable battery, provides an instruction to a communication device of an administrator in charge of handling the rechargeable battery, and changes a mode of the monitoring circuit based on the analyzed sampled battery status.

2. The system according to claim 1, wherein the monitoring circuit comprises a voltage sensor, a current sensor and a resistance sensor.

3. The system according to claim 1, wherein the monitoring circuit comprises a global positioning system chip.

4. The system according to claim 1, wherein the monitoring circuit comprises a temperature sensor.

5. The system according to claim 1, wherein the monitoring circuit periodically communicates the status information to the server at a lower frequency than sampling the status.

6. The system according to claim 1, wherein the monitoring circuit includes a storage mode of operation in which the monitoring circuit tests the rechargeable battery to determine if the rechargeable battery has been connected to a consumer device to be charged and provide power, and does not communicate with the server.

7. The system according to claim 1, wherein the status of the rechargeable battery includes measurement of internal resistance and internal charge.

8. The system according to claim 1, wherein the server builds a statistical model from the sampled status of multiple monitoring circuits, to recommend maintenance of the battery based on the sampled status of the rechargeable battery.

9. The system according to claim 1, wherein the server trains a neural network from the sampled status of multiple monitoring circuits, to recommend maintenance of the rechargeable battery based on the sampled status of the battery.

10. A method of monitoring rechargeable batteries, comprising:
    periodically sampling, by a monitoring circuit, a status of a rechargeable battery, wherein the monitoring circuit is installed in the rechargeable battery and
    automatically changing, by the monitoring circuit, a mode of operation when the monitoring circuit identifies that the rechargeable battery started to receive charge or started to provide charge at the inputs or outputs of the rechargeable battery, wherein the mode controls an amount of power consumed by the monitoring circuit;
    communicating, by a wireless transceiver, the sampled status to a server;
    analyzing, by the server, the sampled status from the monitoring circuit of the rechargeable battery;
    providing an instruction to a communication device of an administrator in charge of handling the rechargeable battery; and
    changing, by the server, the mode of the monitoring circuit based on the analyzed sampled battery status.

11. The method according to claim 10, wherein the monitoring circuit comprises a voltage sensor, a current sensor and a resistance sensor.

12. The method according to claim 10, wherein the monitoring circuit comprises a global positioning system chip.

13. The method according to claim 10, wherein the monitoring circuit comprises a temperature sensor.

14. The method according to claim 10, wherein the monitoring circuit periodically communicates the status information to the server at a lower frequency than sampling the status.

15. The method according to claim 10, wherein the monitoring circuit includes a storage mode of operation in which the monitoring circuit tests the rechargeable battery to determine if the rechargeable battery has been connected to a consumer device to be charged and provide power, and does not communicate with the server.

16. The method according to claim 10, wherein the status of the rechargeable battery includes measurement of internal resistance and internal charge.

17. The method according to claim 10, wherein the server builds a statistical model from the sampled status of multiple monitoring circuits, to recommend maintenance of the battery based on the sampled status of the rechargeable battery.

18. The method according to claim 10, wherein the server trains a neural network from the sampled status of multiple monitoring circuits, to recommend maintenance of the rechargeable battery based on the sampled status of the battery.

* * * * *